United States Patent [19]

Jerman

[11] Patent Number: 5,328,559
[45] Date of Patent: Jul. 12, 1994

[54] GROOVE WIDTH TRIMMING

[75] Inventor: John J. Jerman, Palo Alto, Calif.

[73] Assignee: IC Sensors, Inc., Milpitas, Calif.

[21] Appl. No.: 941,997

[22] Filed: Sep. 8, 1992

[51] Int. Cl.$^5$ .............. H01L 21/306; B44C 1/22; C03C 15/00

[52] U.S. Cl. .................. 156/647; 156/626; 156/633; 156/648; 156/651; 156/662; 257/662; 437/68; 437/72; 437/73; 437/228; 437/927

[58] Field of Search ........... 156/626, 633, 647, 648, 156/651, 654, 659.1, 662; 437/65, 66, 68, 72, 73, 228, 927; 257/466, 510, 618, 622, 628; 428/163, 166

[56] References Cited

U.S. PATENT DOCUMENTS

| | | | |
|---|---|---|---|
| 4,017,885 | 4/1977 | Kendall et al. | 156/648 X |
| 4,169,000 | 9/1979 | Riseman | 437/65 |
| 4,178,197 | 12/1979 | Marinace | 156/647 X |
| 5,023,188 | 6/1991 | Tanaka | 156/626 |
| 5,098,856 | 3/1992 | Beyer et al. | 437/65 |
| 5,155,061 | 10/1992 | O'Connor et al. | 437/927 X |

*Primary Examiner*—William A. Powell
*Attorney, Agent, or Firm*—Skjerven, Morrill, MacPherson, Franklin & Friel

[57] ABSTRACT

A method for making a groove of a precise width in a substrate material. The groove may have any cross-sectional shape. The groove is formed by initially etching the substrate material. The groove width is then measured. The measured groove width is compared to the desired groove width. Oxide is grown on the substrate in the region of the groove to adjust the width of the groove. The oxide may or may not be grown with the original etchant mask left on the substrate. Depending on whether it is desired to increase or decrease the groove width, the oxide is or is not removed. The process for increasing or decreasing groove width may be repeated any number of times as necessary to achieve a proper groove width. A number of grooves may be formed using these processes. For many applications, the groove will be covered with a plate or other type of cap to define a channel as used in flow restrictors. Where groove width is difficult or impossible to measure, the cross-sectional area of the channel formed by capping a groove formed in a substrate may be varied by growing, then removing or leaving as appropriate, an oxide layer on the interior channel surfaces. The process is particularly useful for making reproducible flow restrictors in a silicon substrate.

32 Claims, 8 Drawing Sheets

GROOVE WIDTH TRIMMING

BACKGROUND OF THE INVENTION

1. Field of the Invention

This invention relates to the field of flow channels and to the field of forming microminiature structures in an etchable substrate material. In particular, it relates to the formation of grooves in an etchable substrate material, the grooves being capped to form a flow channel.

2. Prior art

As shown in cross-section in FIG. 1A, a flow channel can be made by etching a groove 103 (often V-shaped) in a substrate material 101 (typically silicon) and covering that groove with a flat plate 102 (typically glass or silicon). Often, a plurality of such grooves 103 are constructed in parallel to form a flow restrictor. A cross-sectional view of such a flow restrictor is shown in FIG. 1B and a top view is shown in FIG. 1C. The top view shows clearly the restriction of flow from the chamber 104 through the grooves 103.

A covered V-shaped groove forms a flow channel with a triangular cross-sectional shape. Flow through such a triangular channel is a function of the fourth power of the effective diameter of the groove. The effective diameter is approximately equal to the diameter of the largest circle that can be inscribed within the triangular cross-section of the channel. Since the flow is so sensitive to the magnitude of the effective diameter, small changes in the width 105 of the groove result in large differences in flow rate through the groove for a given pressure drop. Thus, it is important to be able to manufacture grooves so that the width of the groove has a small tolerance.

The shape of a V-groove etched in silicon is determined by the orientation of the crystal planes in the silicon. It might seem, then, that the magnitude of the width of the groove is set by the crystal planes, thus enabling easy repeatability in the manufacture of grooves of a given width and tolerance. In practice, however, the width of a V-groove is dependent on many parameters such as lithography and mask tolerances, orientation of the silicon material, undercutting of the etch mask, and anisotropy of the silicon etchants. The combination of these variables can account for errors of up to approximately 5% (between 1 and 5 micrometers depending on the size of the V-groove) in the width of a groove.

Medical infusion devices are a typical application for the flow restrictor channels described above. A commercially useful flow rate for such devices is about 0.5 ml/hr. This flow rate is produced by, for example, a flow restrictor channel with a width of 23 micrometers, a length of 200 micrometers, and a differential pressure of 7.5 psi. A change of 1 micrometer (4.3%) in groove width, as may easily result due to the factors discussed above, results in a flow change of about 17%, greater than can be tolerated in a commercial device. A variation of ±5% in flow rate is desirable for these devices. In order to stay within this flow rate tolerance, the width of the groove needs to be controlled to within ±1.2% (approximately ±0.28 micrometers for a groove width of 23 micrometers).

The ability to control the width of a groove to a maximum error of 0.28 micrometers is very difficult using current methods. In particular, it is difficult to purchase silicon wafers with a flat which is aligned with sufficient accuracy to the 110 crystal direction along which the V-grooves will be aligned. For a given etch time, wafers having flats which are misaligned by more than 0.2° will yield significant increases in groove width during the anisotropic silicon etch as compared to wafers with perfectly aligned flats.

Thus, there is a need for the ability to form grooves in a substrate material with greater accuracy than is currently possible. In particular, it is desirable to be able to adjust the width of the groove after it has initially been formed by etching.

SUMMARY OF THE INVENTION

In accordance with the invention, a method is described for forming a groove in an etchable substrate material. The groove may have any cross-sectional shape. The groove is formed initially by conventionally etching the substrate material. The groove width is then measured. The measured groove width is compared to the desired groove width. Oxide is grown on the substrate in the region of the groove; the amount (thickness) of oxide grown is determined based on the comparison of the initial groove width to the desired groove width. The oxide may or may not be grown with the original etchant mask left on the substrate. Depending on whether it is desired to increase or decrease the groove width, the oxide may or may not be removed. If the mask is left on while growing the oxide, it is typically removed after the groove is adjusted to the desired width, though this may not be necessary. The processes described make it possible to make reproducible grooves with a low groove width tolerance.

The process for increasing or decreasing ("trimming") groove width may be repeated any number of times as desired or as necessary to achieve a proper groove width. A plurality of grooves may be formed using these processes. For many applications, the groove is covered with a plate or other type of cap to form a channel as used in flow restrictors.

Further in accordance with the invention, a method is described for trimming groove width after a groove formed in a substrate has been covered with a plate or other type of cap to form a channel. The flow through the channel is measured and compared to the desired flow. Oxide is grown on the groove walls and the surface of the cap facing the groove. The amount of oxide grown is determined based on the comparison of the measured flow to the desired flow. The oxide growth decreases the effective diameter of the channel. Depending on whether it is desired to increase or decrease the flow through the channel, the oxide may be etched away or not. This method makes it possible to make reproducible grooves with a low groove width tolerance when it may be difficult or inconvenient to accurately measure the width of the groove.

The invention is particularly useful for making flow restrictors having highly reproducible widths in silicon.

DETAILED DESCRIPTION OF THE PREFERRED EMBODIMENTS

Figure 1A:
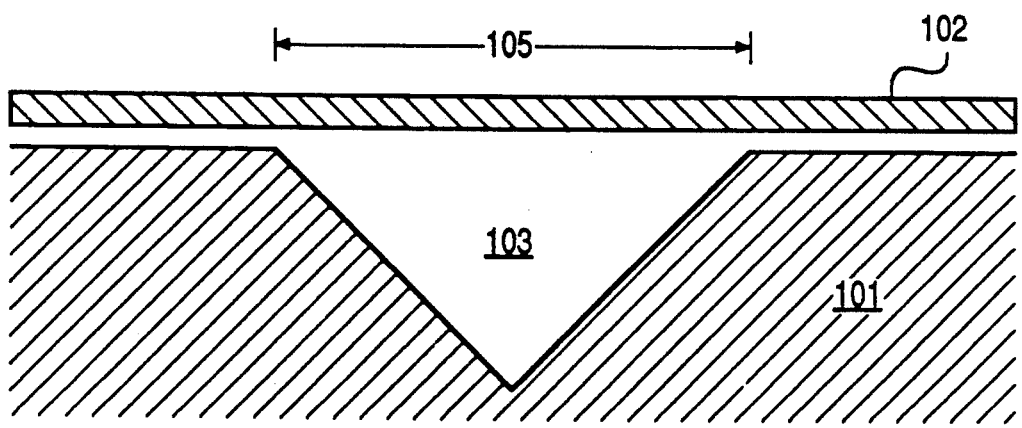
FIG. 1A is a cross-sectional view of a prior art flow channel formed by covering a groove in a substrate material with a plate.
Figure 1B:
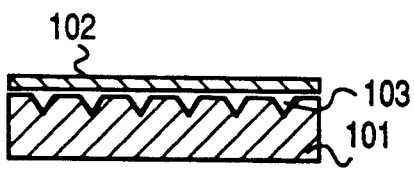
FIG. 1B is a cross-sectional view of a prior art flow restrictor device with a plurality of flow channels as shown in FIG. 1A.
Figure 1C:
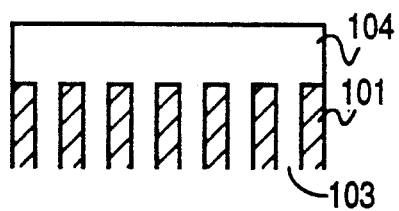
FIG. 1C is a top view of the prior art flow restrictor device of FIG. 1B in which the cover plate has been removed.
Figure 2A:
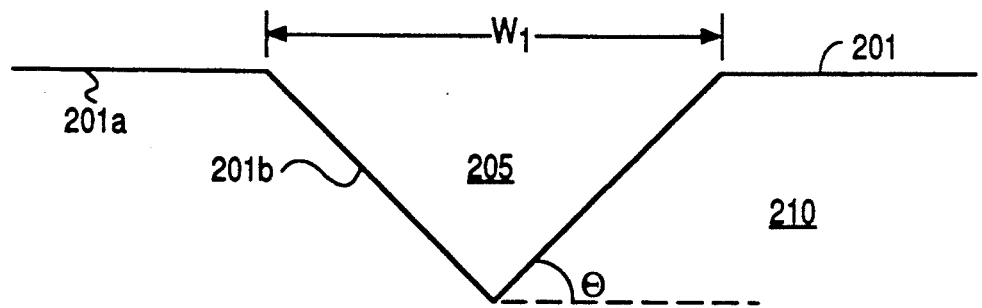
FIGS. 2A-2C show a series of cross-sectional views that illustrate a process for increasing the width of a V-shaped groove in a substrate material according to one embodiment of the invention.
Figure 2B:
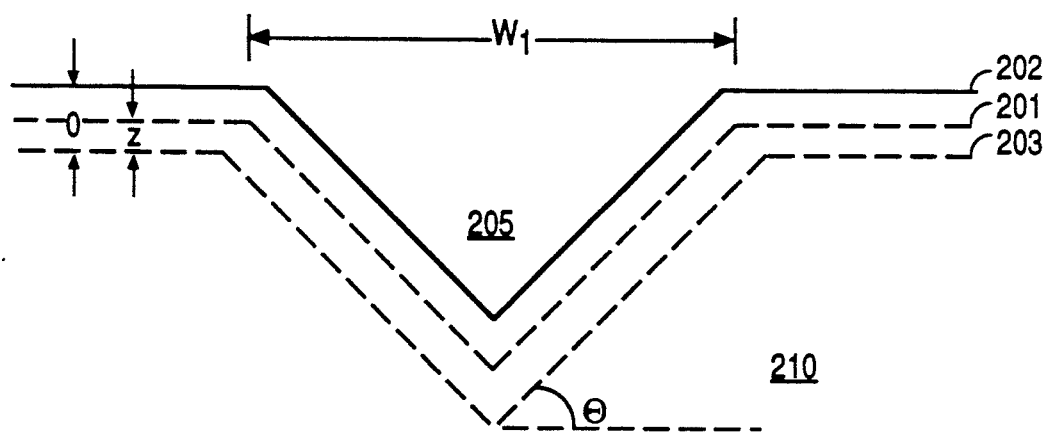
Figure 2C:
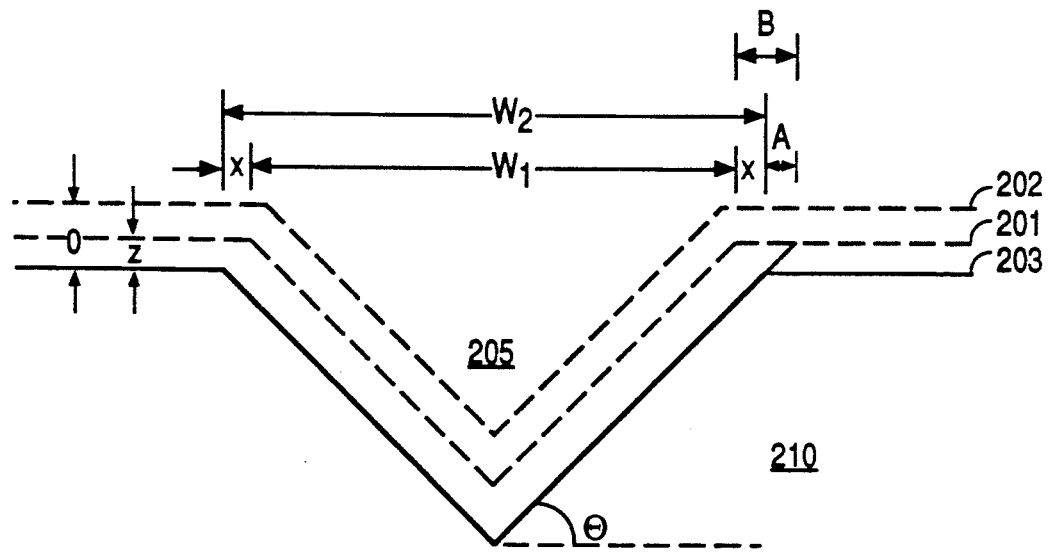

FIGS. 2A-2C show a series of cross-sectional views that illustrate a process for increasing the width of a V-shaped groove 205 in a substrate material 210 according to one embodiment of the invention. The groove 205 is initially formed by masking and etching the principal surface 201a of a substrate material 210, as is well known in the art, to produce a V-shaped groove 205 as shown in FIG. 2A. The groove side walls 201b are formed at an angle e to the surface of the substrate and the groove 205 has a width $W_1$. The groove 205 is made such that, even with worst-case processing conditions, the groove width $W_1$ is narrower than the width that is ultimately desired. After etching, the groove width is measured using a conventional line width measuring instrument. This measurement is used to determine how much the groove 205 is to be widened.

Depending on how much the groove 205 is to be widened, a certain thickness Z of substrate material 210 is oxidized as shown in FIG. 2B. If, for instance, the substrate material 210 is silicon, this oxidation may occur by conventionally subjecting the silicon to a thermal oxidation in which the exposed surface 201 is converted to silicon dioxide at high temperatures in the presence of oxygen or water vapor. Oxidation of a layer of silicon with thickness Z will result in an oxidized layer with a somewhat greater thickness O as shown in FIG. 2B, such that the thickness Z is about 44.3% of the thickness O. Consequently, surface 202 of the silicon dioxide is raised as compared to the original surface 201 of the silicon. For oxidations of 1 hour at 1100° C., approximately 0.64 micrometers of oxide is grown, and the thickness of the oxide grown on the principal surface 201a of the substrate 210 is within approximately 3% of the thickness of the oxide grown on the groove side walls 201b. As shown in FIG. 2C, when the silicon dioxide is conventionally removed using an etchant (such as hydrofluoric acid), the resultant silicon surface 203 is lowered as compared to the original surface 201. Since the groove side walls 201b are relatively steep, the width of the groove 205 will be increased when the oxidized silicon is removed.

The amount by which the groove 205 is widened is given by the set of equations below, the pertinent variables of which are illustrated in FIG. 2C.

$$A = Z/\tan\theta \quad (1)$$
$$B = Z/\sin\theta \quad (2)$$
$$X = B - A = Z * (1/\sin\theta - 1/\tan\theta) \quad (3)$$
$$W_2 = W_1 + 2X = W_1 + [2Z * (1/\sin\theta - 1/\tan\theta)] \quad (4)$$

As can be seen in FIG. 2C, the original groove width $W_1$ has been increased by a distance X on both sides of the groove 205 to create a new groove width $W_2$. (Note that the bottom of the groove 205 also gets deeper, but this change is relatively insignificant since the bottom of the groove 205 contributes very little to the magnitude of the flow.) For $\Theta = 54.7°$ (the angle of the groove side walls formed by anistropically etching silicon), the groove 205 width thickness increase (2X) is equal to 1.034Z. If, as noted above, the thickness Z is 44.3% of the oxide thickness O, then the groove width increase is about 45.8% of the oxide thickness. Since it is convenient to grow oxides between approximately 0.5 and 1.0 micrometers, the groove width can be easily increased by between 0.2 and 0.5 micrometers.

The process described above may be repeated any number of times in order to achieve a particular groove width. However, it is desirable that the number of iterations be minimized so as to make the groove width trimming process more efficient. In practice, this is made easier to do by the fact that oxides can be grown over a wide range of thicknesses. Since the groove width increase is about half the oxide thickness, this wide range of possible groove width increases allows a wide range of groove widths to be reached from a particular starting groove width, increasing the likelihood that only one groove width trim process will be necessary in order to achieve the desired groove width.

Figure 3A:
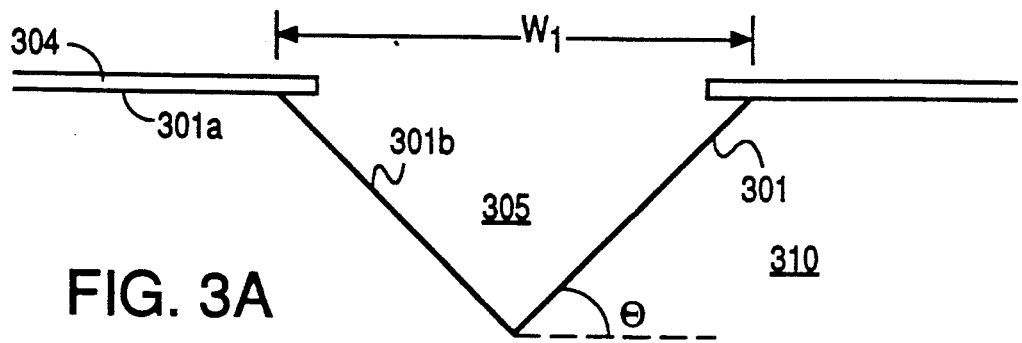
FIGS. 3A-3D show a series of cross-sectional views that illustrate a process for increasing the width of a V-shaped groove in a substrate material according to another embodiment of the invention.

FIGS. 3A-3D show a series of cross-sectional views that illustrate a process for increasing the width of a V-shaped groove 305 in a substrate material 310 according to another embodiment of the invention. In this embodiment, the mask 304 used in the initial groove etch is one which inhibits the growth of oxide on surfaces that it covers, e.g., a nitride mask. Nitride masks conventionally are often used with silicon substrates due to their high resistance to anisotropic silicon etchants, especially KOH in water. After the silicon etch to form the groove 305, the mask 304 is typically undercut a small amount, as shown in FIG. 3A, due to the misalignment of the groove 305 with respect to the exact 110 silicon crystallographic direction and due to the small etch rate of 111 crystal planes by the anisotropic etchant. Though, because of the undercutting, the width of the groove 305 is partially hidden by the mask 304, it is possible to measure the width $W_1$ of the groove 305 with conventional line width measuring instruments while the mask 304 is still in place.

Figure 3B:
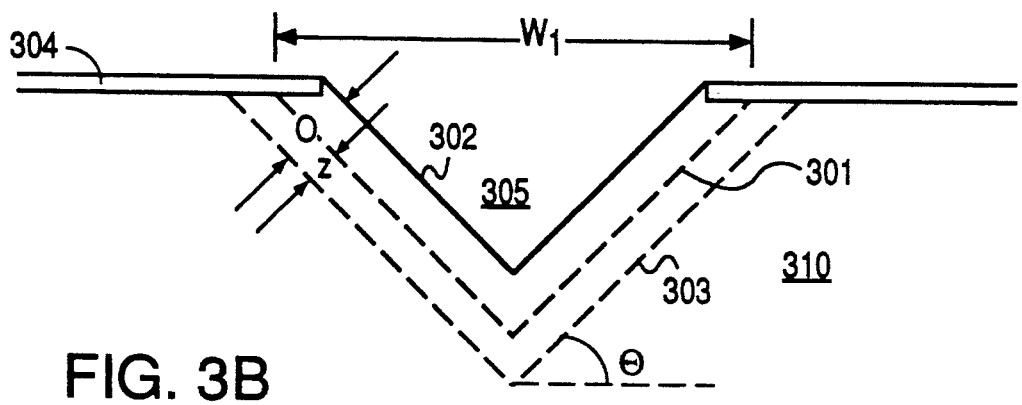

After the width $W_1$ of the groove 305 is measured, oxide is grown on the substrate 310 while the mask 304 is still in place as shown in FIG. 3B. Since the mask 304 prevents oxidation of the substrate surface 301a under the mask 304, the oxide only grows on the groove walls 301b. The oxide growth within the groove 305 creates a new surface 302 raised above the former groove surface 301. The oxidation uses up a thickness Z of substrate material and creates a layer of oxidized substrate of thickness O.

Figure 3C:
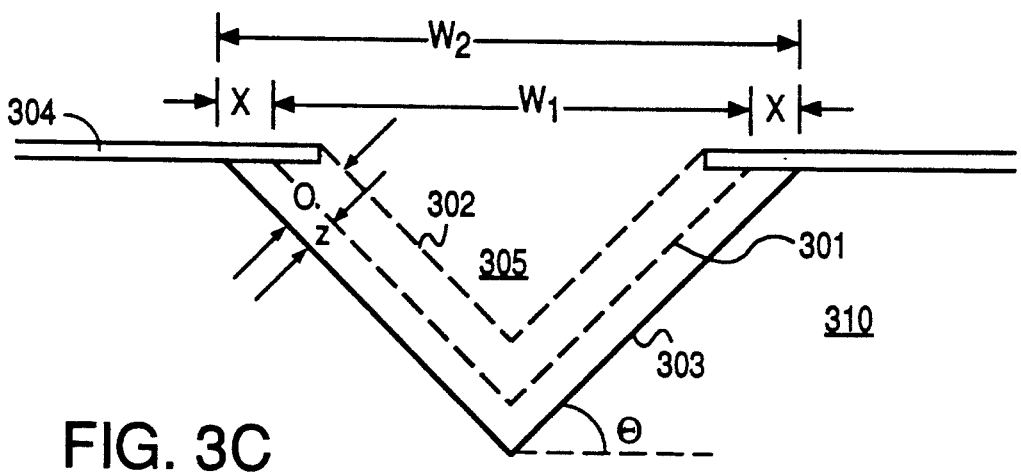
Figure 3D:
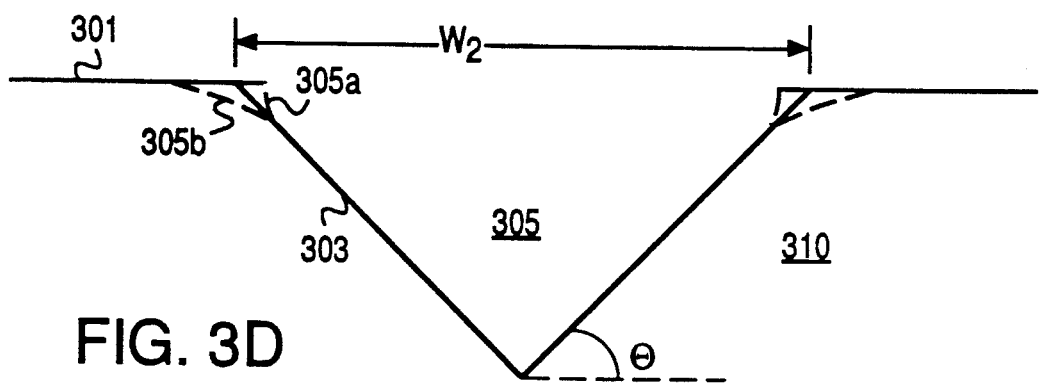

After oxidation, the oxide is conventionally removed with an etchant (for example, hydrofluoric acid when the substrate 310 is silicon) as shown in FIG. 3C, exposing a silicon surface 303 that is lowered relative to the original silicon surface 301. Finally, the mask 304 is removed with an etchant (for example, a heated phosphoric acid mixture when a nitride mask is used) as shown in FIG. 3D. The remaining groove 305 in the substrate 310 is wider due to the removal of substrate material from the original groove surface 301. The amount by which the groove 305 is widened is given by the set of equations below, the pertinent variables of which are illustrated in FIG. 3C.

$$X = Z/\sin\Theta \tag{5}$$

$$W_2 = W_1 + 2X = W_1 + 2Z/\sin\Theta \tag{6}$$

As shown in the figure, the new width $W_2$ is larger than the initial width $W_1$ by an amount 2X. For $\Theta = 54.7°$, the groove width increase (2X) is equal to 2.44Z. If, as noted above, the thickness Z is 44.3% of the oxide thickness O, then the groove width increase is about 108% of the oxide thickness. This groove width increase is about 2.36 times as large as the increase associated with the total oxidation process of FIGS. 2A-2C. Thus, this technique can be used to widen grooves much more than that process. However, since the groove width increase is much more sensitive to changes in the oxide thickness O, control of the groove width increase is somewhat more difficult.

The groove width increase given above is actually an idealized increase. In practice, the groove width (as measured at the top surface 301a of the groove) increases by an amount somewhat different than the quantity 2X due to a two-dimensional interaction of the oxidation process under the mask 304. This effect is a variation of the well known "bird's beak" phenomenon encountered in integrated circuit processing. Due to this effect, the groove wall 303 does not have a perfectly sharp intersection with the original substrate surface 301. The actual shape of the intersection between groove wall 303 and original substrate surface 301 is approximately as shown by one of the two dashed lines 305a, 305b in FIG. 3D. As a practical matter, this phenomenon has little effect on the flow rate and so is not of concern for that reason. However, the presence of this feature may adversely effect the measurement of groove width, causing inaccuracy in subsequent groove width trims.

Figure 4A:
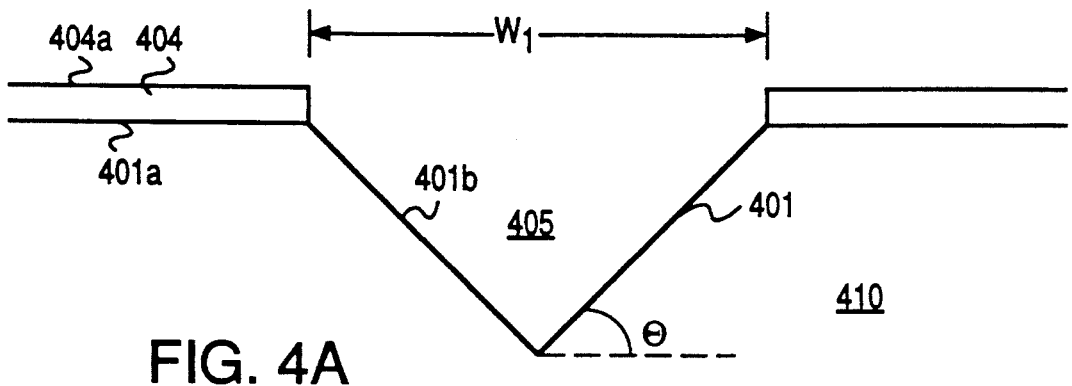
FIGS. 4A-4C show a series of cross-sectional views that illustrate a process for increasing the width of a V-shaped groove in a substrate material according to another embodiment of the invention.
Figure 4B:
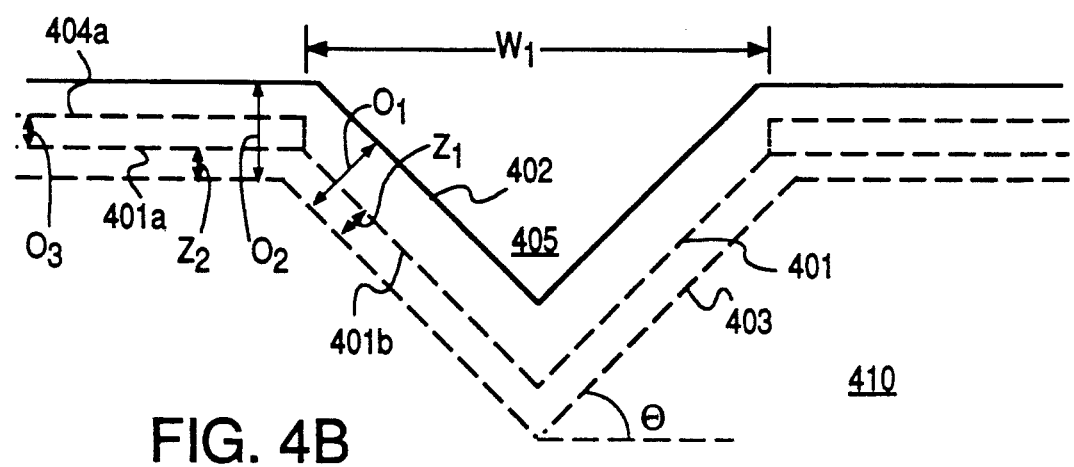
Figure 4C:
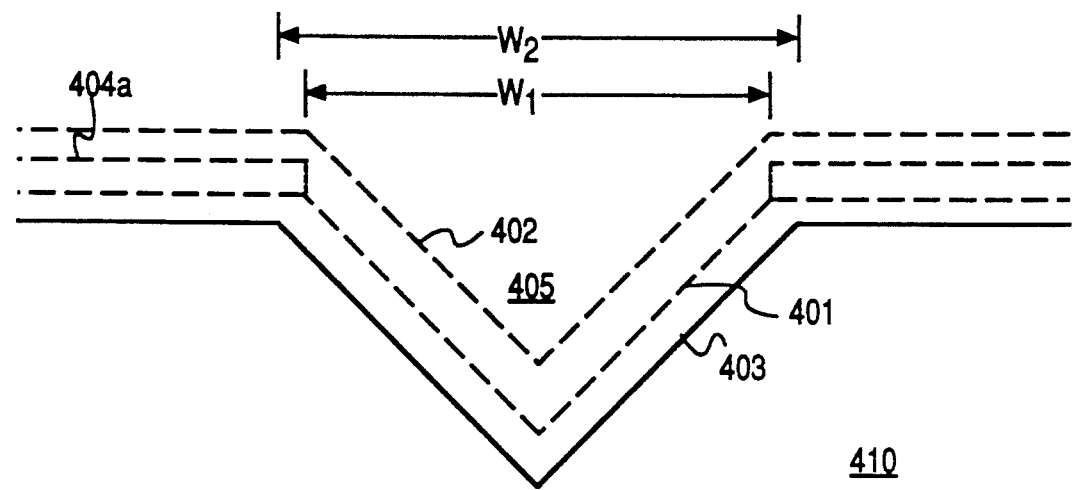

FIGS. 4A-4C show a series of cross-sectional views that illustrate a process for increasing the width of a V-shaped groove 405 in a substrate material 410 according to another embodiment of the invention. As in the process illustrated in FIGS. 3A-3D, the mask 404 is left on the principal surface 401a of the substrate 410 after the original groove etch. In this embodiment, however, the mask 404 is made of an oxide of the substrate material 410. FIG. 4A shows a cross-sectional view of the groove 405 after the initial etch of the substrate material 410.

After the groove width W, is measured, with the mask 404 still in place, oxide is grown on the substrate surface 401 as shown in FIG. 4B. Here, unlike the process illustrated in FIGS. 3A-3C, both the substrate principal surface 401a under the mask 404 and the groove side wall surface 401b are oxidized. However, due to the presence of the mask 404, the groove side wall surface 401b is oxidized more rapidly than the principal surface 401a of the substrate underlying the oxide mask 404. Since the groove width increase is a function of both the thickness $O_1$ of the oxide grown on the groove side wall surface 401b and the thickness $O_2$-$O_3$ of the oxide grown on the principal surface 401a, it is necessary to quantify the relationship between the two thicknesses $O_1$ and $O_2$-$O_3$ in order to accurately increase the groove width $W_1$.

Generally, oxide growth is described by the well known Deal and Grove model for silicon oxidation as described in the Journal of Applied Physics, vol. 36 (1965) at page 3770, which disclosure is incorporated herein by reference. The equation describing this model is, $$z^2 + Az = B*(t + \tau) \tag{7}$$

where z represents the oxide thickness, A and B are the so-called linear and parabolic rate constants, t is time and $\tau$ is the time displacement that accounts for the presence of an initial oxide layer.

Equation (7) is used to solve for the time displacement $\tau$ associated with the oxide thickness $O_3$ of mask 404. Once the time displacement $\tau$ is known, Equation (7) can be used to determine the oxide thickness $O_2$-$O_3$ that is grown on the substrate principal surface 401a for a given time t. The oxide thickness $O_1$ that is grown on the groove side wall surface 401b for time t is also determined from Equation (7).

The groove width increase is a function of the thicknesses $Z_1$ and $Z_2$ shown in FIG. 4B. The thicknesses $Z_1$ and $Z_2$ are, as noted above, approximately 44.3% of the thicknesses $O_1$ and $O_2$-$O_3$ respectively, so that the groove width increase is a function of the thicknesses O, and $O_2$-$O_3$. Thus, the groove width increase is controlled by appropriately adjusting the length of time t that oxide is grown so as to achieve the desired thicknesses $O_1$ and $O_2$-$O_3$.

After the oxide is grown, an etchant is used to remove the oxide material as shown in FIG. 4C. The resultant substrate surface 403 is lowered as compared to the original surface 401. The width of the groove 405 is increased from $W_1$ to $W_2$.

The process described with respect to FIGS. 4A-4D has an advantage over the process illustrated in FIGS. 3A-3D in that both the mask and the oxide may be removed in the same step, thus eliminating a step as compared to the process of those figures.

Figure 5A:
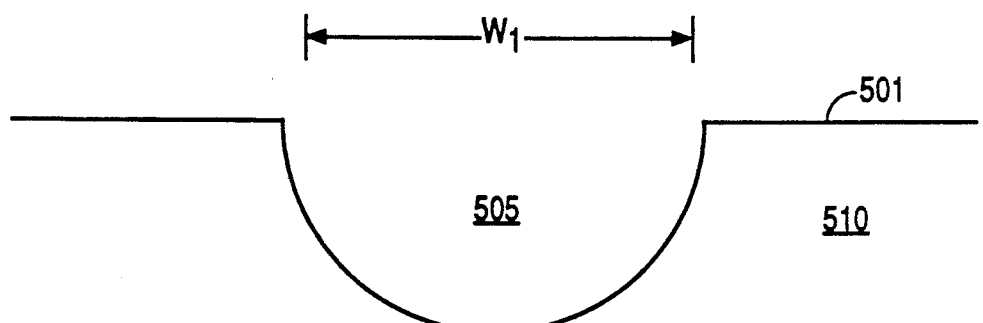
FIGS. 5A-5C show a series of cross-sectional views that illustrate a process for increasing the width of a U-shaped groove in a substrate material according to one embodiment of the invention.
Figure 5B:
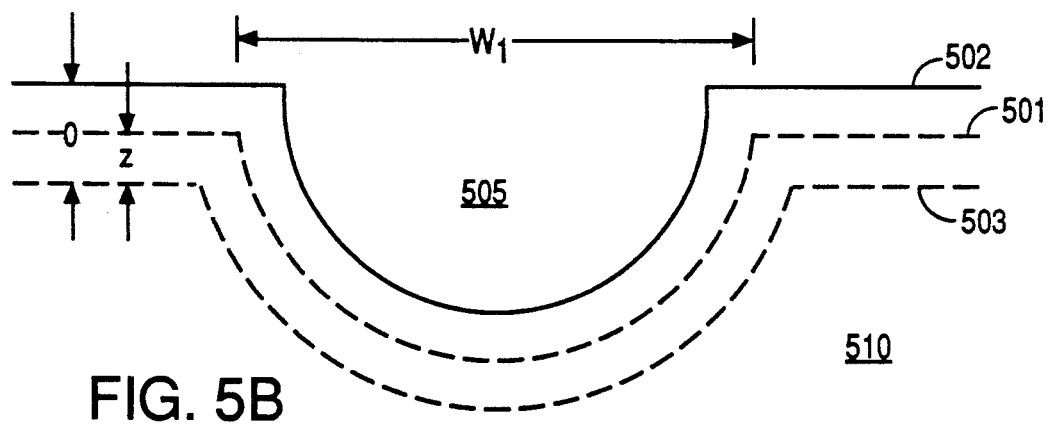
Figure 5C:
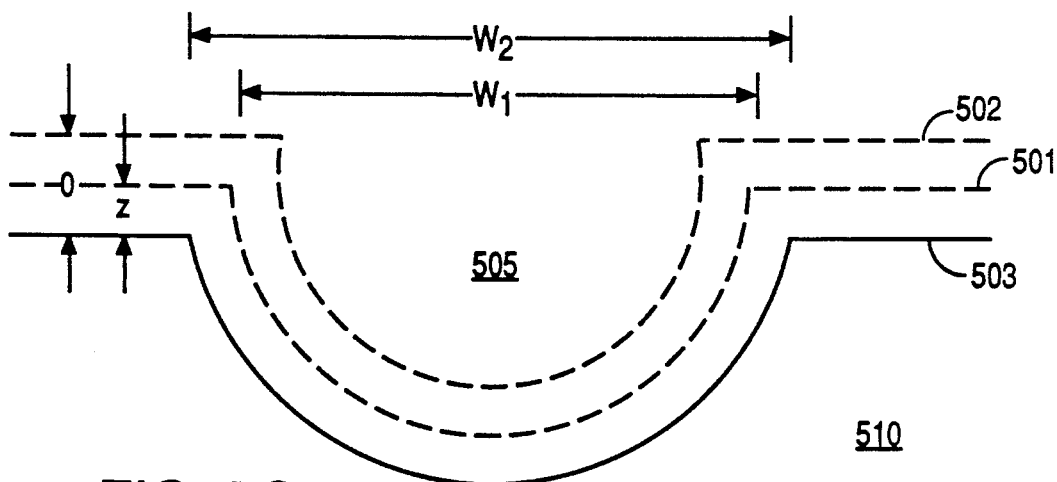

FIGS. 2-4 describe a groove having a V-shaped cross-section. However, grooves with other cross-sectional shapes can be formed with the processes illustrated by those figures. FIGS. 5A-5C show a series of cross-sectional views that illustrate a process for increasing the width of a U-shaped groove 505 in a substrate material 510 according to the same process as shown in FIG. 2. Surfaces designated as 501, 502 and 503 in FIGS. 5A-5C are analogous to surfaces 201, 202 and 203, respectively, in FIGS. 2A-2C. Though the width of a U-shaped groove 505 may be widened as shown in the figure, the shape of the groove 505 makes calculation of the groove width increase problematic. Therefore, the process is less desirable for use with U-shaped grooves.

Figure 6A:
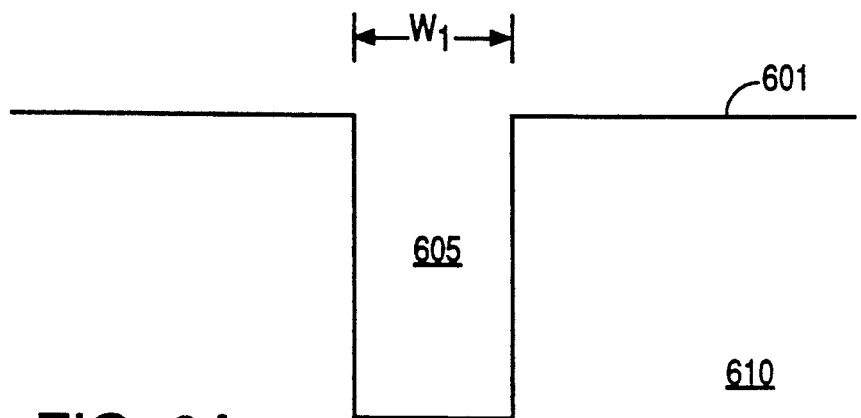
FIGS. 6A-6C show a series of cross-sectional views that illustrate a process for increasing the width of a rectangular-shaped groove in a substrate material according to one embodiment of the invention.
Figure 6B:
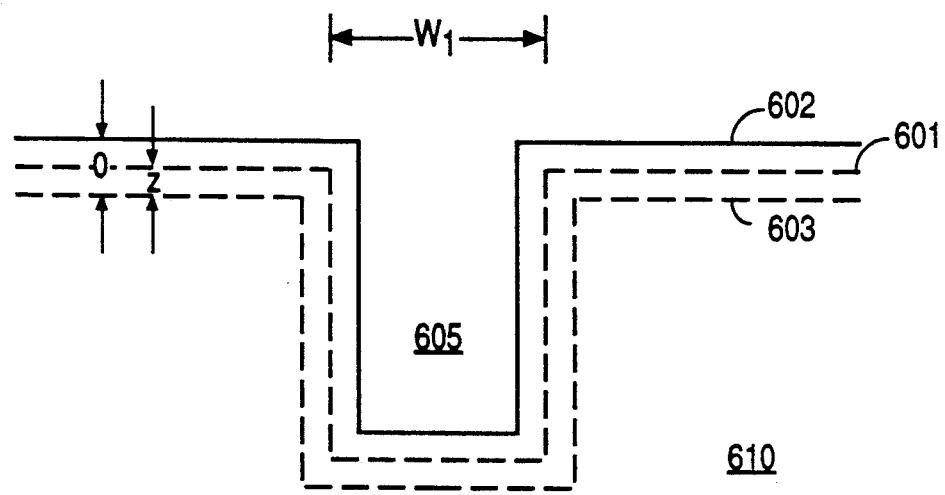
Figure 6C:
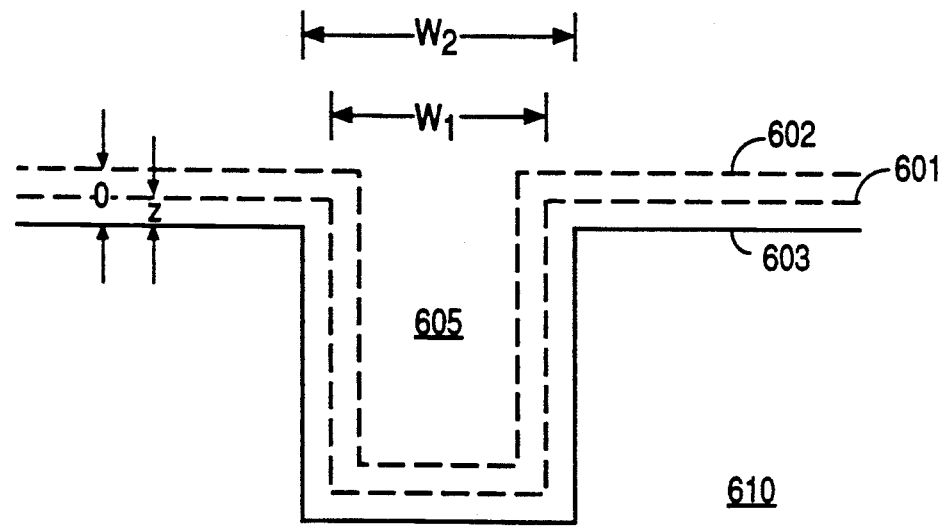

FIGS. 6A-6C show a series of cross-sectional views that illustrate a process for increasing the width of a rectangular-shaped groove 605 in a substrate material 610 according to the same process as shown in FIG. 2. Surfaces designated as 601, 602 and 603 in FIGS. 6A-6C are analogous to surfaces 201, 202 and 203, respectively, in FIGS. 2A-2C. For grooves with this cross-sectional shape, the calculation of the groove width increase is much more straightforward. The groove width increases by an amount equal to twice the thickness Z of substrate material that is oxidized during the oxidation step. Alternatively, if, as mentioned above, the thickness Z is about 44.3% of the thickness O of the oxide grown on the substrate, then the groove width increase will be equal to 88.6% of the oxide thickness O.

Figure 7A:
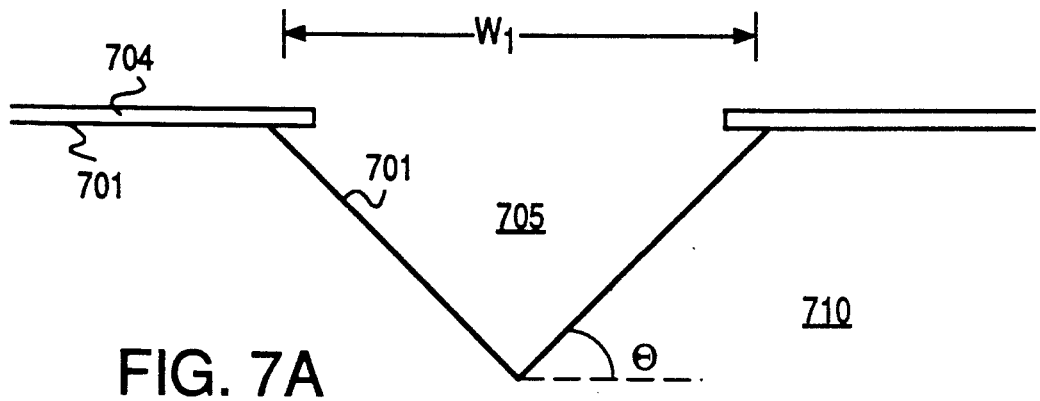
FIGS. 7A-7C show a series of cross-sectional views that illustrate a process for decreasing the width of a V-shaped groove in a substrate material according to one embodiment of the invention.
Figure 7B:
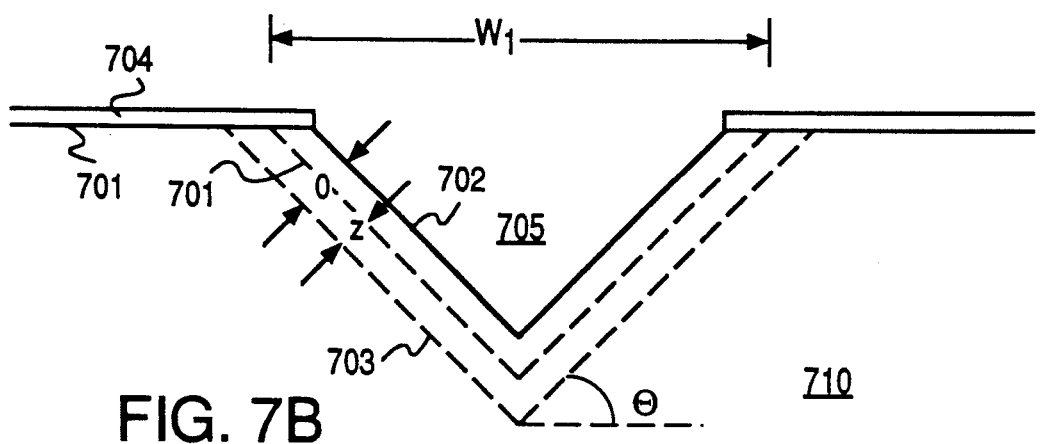
Figure 7C:
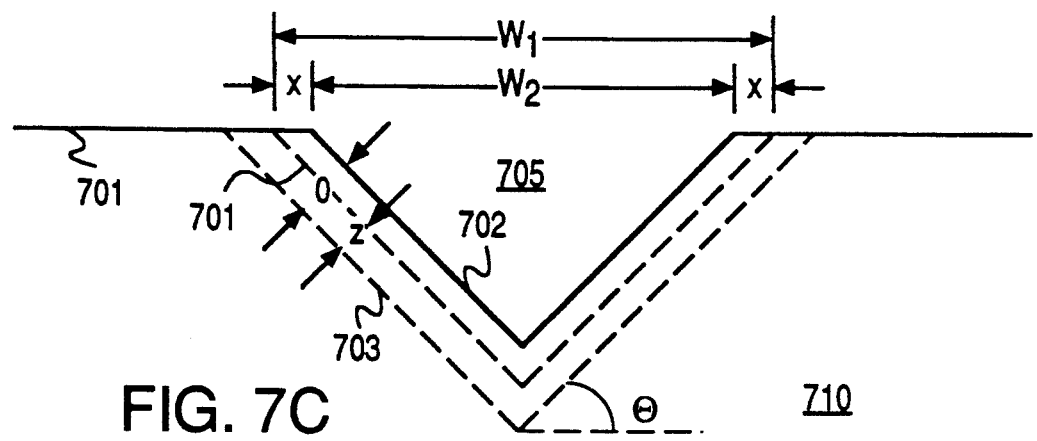

All of the processes described above involve the changing of groove width by increasing the width of the groove. FIGS. 7A-7C show a series of cross-sectional views that illustrate a process for decreasing the width of a V-shaped groove 705 in a substrate material 710 according to another embodiment of the invention. This process is similar in its initial steps to that shown in FIG. 3. A groove 705 is initially formed by masking and etching the surface 701 of a substrate material 710 as shown in FIG. 7A. However, rather than etching away the oxide layer after it is grown as shown in FIG. 7B, that layer is left on the substrate so that surface 702 forms the interior of the groove 705. After growth of the oxide layer, the mask 704 is etched away as shown in FIG. 7C. The newly formed groove 705 has a width $W_2$ smaller than the original width $W_1$. The amount by which the groove width is decreased is given by the set of equations below, the pertinent variables of which are illustrated in FIG. 7C.

$$X = (O - Z)/\sin\Theta \quad (8)$$

$$W_2 = W_1 - 2X = W_1 - 2(O - Z)/\sin\Theta \quad (9)$$

As shown in the figure, the new width $W_2$ is less than the initial width $W_1$ by an amount 2X. For $\Theta = 54.7°$, the groove width thickness decrease (2X) is equal to 2.44(O-Z). If the thickness Z is 44.3% of the oxide thickness O, then the groove width thickness decrease is about 136% of the oxide thickness.

Although the groove width decreasing process shown in FIG. 7 is similar to that of FIG. 3, processes analogous to those of both FIGS. 2 and 4 could also be used to decrease the groove width. The advantages and disadvantages of each approach for decreasing the groove width are the same as for the analogous groove width increasing processes shown in FIGS. 2 through 4. Further, the groove width decreasing processes could also be used for grooves with U-shaped or rectangular cross-sections.

Figure 8A:
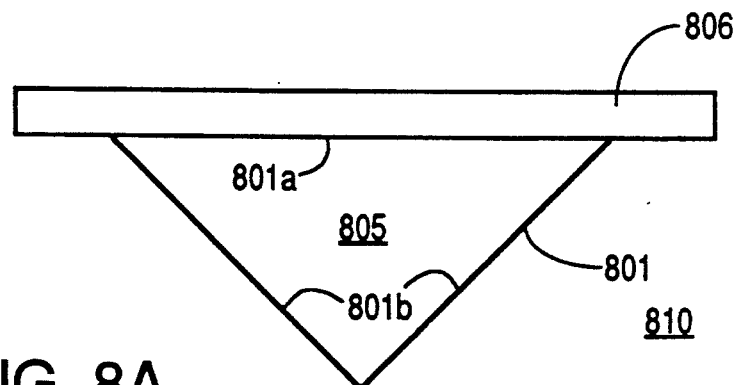
FIGS. 8A-8C show a series of cross-sectional views that illustrate a process for decreasing or increasing the cross-sectional area of a channel formed by a V-shaped groove in a substrate material and a plate or cap according to an embodiment of the invention.
Figure 8B:
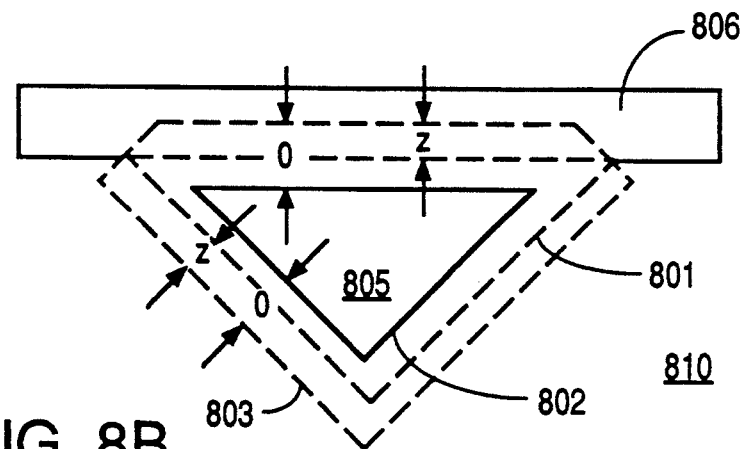
Figure 8C:
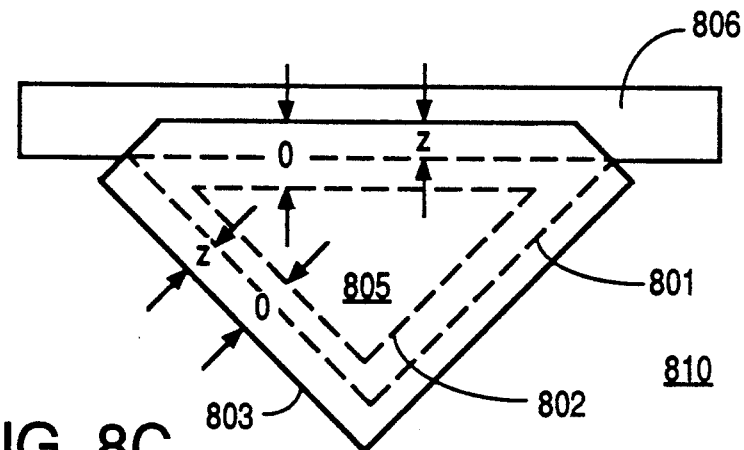

All of the processes described above involve the changing of the width of a groove before the capping of the groove to form a channel. FIGS. 8A-8C show a series of cross-sectional views that illustrate a process for changing the cross-sectional area, and thus the flow rate, of a channel after a V-shaped groove formed in a substrate has been capped. A groove 805 is formed in a substrate 810 conventionally by masking and etching. The masking layer (not shown) is then etched away. A plate 806 of any suitable thickness is bonded to the substrate 810. The plate 806 and substrate 810 may both be, for instance, silicon, and may be bonded by, for instance, so-called fusion or direct wafer bonding, a technique for bonding two silicon wafers together at high temperatures, as is well known in the art.

Typically, access holes (not shown) are provided through the substrate 810 or plate 806 to allow the flow through the channel to be measured. The fluid flow is measured and compared to the desired rate. Oxide is grown on the interior surface 801 of the channel, i.e., on the underside 801a of the plate 806 and on the groove side walls 801b. The oxide may be grown in, for example, a high temperature oxidizing ambient. If the channel is initially purged of inert gas by, for example, vacuum pumping and backfilling with oxygen, the consumption of oxygen during the oxidation process will draw in more oxygen through the access holes to the channel, resulting in substantially the same oxide thickness O on the interior surface 801 of the channel as on the exterior of the substrate 810 or the plate 806, thus enabling good control of the oxide growth on the surface 801. (The oxide grown on the exterior surfaces is not shown in FIGS. 8A-8C.)

The growth of the oxide results in a new interior surface 802 such that the cross-sectional area of the channel is reduced. The growth of the oxide consumes a thickness Z of silicon equal to about 44% of the oxide thickness O. Depending on whether it is desired to increase or decrease the flow rate through the channel, the oxide is removed or left. The oxide may be removed by flowing an oxide etchant, such as a hydrofluoric acid mixture, through the channel. If the oxide is removed, a new interior surface 803 is formed such that the cross-sectional area of the channel is increased. After growth and, if desired, removal of oxide, the flow through the channel is re-measured. Further oxidation growth and/or removal is performed until the desired channel flow rate is achieved.

The above descriptions are with respect to the formation of one groove. However, it is to be understood that the processes described above are equally applicable to the formation of a plurality of grooves in a substrate material and, in fact, it is anticipated that this will be the usual case. Formation of a plurality of grooves may be done either by forming grooves simultaneously or by forming sets of grooves sequentially. The former approach may be desirable where the application requires a number of different sizes for various grooves. The latter approach may be desirable where the application requires that each groove be of the same width.

Each of the processes described above may be repeated as many times as desirable in order to achieve a desired groove width. After the initial groove etch, successive sets of groove width measurement (directly or indirectly) followed by either a groove width increase or decrease would be performed.

Various embodiments of the invention have been described above. The descriptions are intended to be illustrative, not limitative. Thus, it will be apparent to one skilled in the art that certain modifications may be made to the invention as described without departing from the scope of the claims set out below.

I claim:

1. A method for forming a groove in a substrate, comprising:

forming a groove in the substrate extending from a principal surface of the substrate;

measuring a width of the groove; and then oxidizing an exposed portion of a surface of the substrate in the groove to a predetermined thickness.

2. A method as in claim 1, wherein the step of forming further comprises:
providing a masking material on the principal surface of the substrate, the masking material defining an opening at a location at which the groove is to be formed; and
applying an etchant to the opening, thereby forming a groove.

3. A method as in claim 2 further comprising removing the masking material from the principal surface of the substrate prior to the step of oxidizing.

4. A method as in claim 3 further comprising removing at least part of the oxidized portion.

5. A method as in claim 4 wherein the steps of measuring and oxidizing are performed a plurality of times until a predetermined width of the groove is measured.

6. A method as in claim 5 wherein a plurality of grooves are formed.

7. A method as in claim 6 further comprising mounting a plate to the principal surface of the substrate thereby covering the groove and defining a channel.

8. A method as in claim 1 wherein the groove is V-shaped in cross-section.

9. A method as in claim 1 wherein the groove is U-shaped in cross-section.

10. A method as in claim 1 wherein the groove is rectangular-shaped in cross-section.

11. A method as in claim 1 wherein a plurality of grooves are formed.

12. A method as in claim 1 further comprising oxidizing the principal surface in the vicinity of the groove after performing the measuring step.

13. A method as in claim 2 further comprising removing at least part of the oxidized portion.

14. A method as in claim 2 wherein the masking material is a nitride, and wherein after the etchant is applied the nitride mask overhangs the edges of the groove.

15. A method as in claim 2 wherein the masking material is an oxide of the substrate material.

16. A method for forming a groove in a substrate, comprising:
forming a groove in the substrate extending from a principal surface of the substrate;
measuring a width of the groove;
then oxidizing an exposed portion of a surface of the substrate in the groove to a predetermined thickness; and
mounting a plate to the principal surface of the substrate thereby covering the groove and defining a channel.

17. A method for forming a groove in a substrate, comprising:
forming a groove in the substrate extending from a principal surface of the substrate;
measuring a width of the groove;
then oxidizing an exposed portion of a surface of the substrate in the groove to a predetermined thickness; and
removing at least part of the oxidized portion.

18. A method as in claim 17 wherein the steps of measuring and oxidizing are performed a plurality of times until a predetermined width of the groove is measured.

19. A method as in claim 17 further comprising mounting a plate to the principal surface of the substrate thereby covering the groove and defining a channel.

20. A method for forming a groove in a substrate, comprising:
providing a masking material on the principal surface of the substrate, the masking material having an opening defining a location at which the groove is to be formed;
applying an etchant to the opening, thereby forming a groove;
measuring a width of the groove;
then oxidizing an exposed portion of a surface of the substrate in the groove to a predetermined thickness; and
removing the masking material from the principal surface of the substrate.

21. A method for forming a groove in a substrate, comprising:
providing a masking material on the principal surface of the substrate, the masking material defining an opening at a location at which the groove is to be formed;
applying an etchant to the opening, thereby forming a groove;
measuring a width of the groove;
then oxidizing an exposed portion of a surface of the substrate in the groove to a predetermined thickness;
removing at least part of the oxidized portion; and
removing the masking material from the principal surface of the substrate.

22. A method as in claim 21 further comprising mounting a plate to the principal surface of the substrate, thereby covering the groove and defining a channel.

23. A method for forming a flow channel device, comprising:
forming a groove in a substrate;
capping the groove to form a channel;
measuring a first flow rate of a fluid passing through the channel;
oxidizing a portion of interior surfaces of the channel; and
measuring a second flow rate of the fluid passing through the channel.

24. A method as in claim 23 further comprising removing the oxidized portions of the interior surfaces of the channel.

25. A method as in claim 24 wherein either the step of oxidizing or the step of removing is performed a plurality of times until a predetermined flow rate is achieved.

26. A method as in claim 23 wherein a plurality of channels are formed.

27. A flow channel device comprising:
a substrate including a groove formed in a principal surface of the substrate, an oxide layer of the substrate material being formed on at least one wall of the groove; and
a plate covering the principal surface of the substrate, thereby defining a channel, the channel having at least two ports, each communicating external to the channel.

28. A flow channel device as in claim 27 having a plurality of grooves formed in the principal surface of the substrate to form a plurality of channels, each channel having at least two ports to communicate with points external to the channel.

29. A flow channel device as in claim 27 wherein the groove has a V-shaped cross-section.

30. A flow channel device as in claim 27 wherein the groove has a rectangular-shaped cross-section.

31. A flow channel device as in claim 27 wherein the groove has a U-shaped cross-section.

32. A flow channel device as in claim 27 wherein a first port is formed at a first end of the groove and a second port is formed at a second end of the groove opposite the first end.

* * * * *